United States Patent
George et al.

(10) Patent No.: US 9,277,663 B2
(45) Date of Patent: Mar. 1, 2016

(54) PIVOTING CABLE MANAGEMENT ASSEMBLY

(71) Applicant: Lenovo Enterprise Solutions (Singapore) Pte. Ltd., Singapore (SG)

(72) Inventors: Mary F. George, Cary, NC (US); Daniel P. Kelaher, Holly Springs, NC (US); Paul A. Wormsbecher, Apex, NC (US)

(73) Assignee: Lenovo Enterprise Solutions (Singapore) Pte. Ltd., Singapore (SG)

(*) Notice: Subject to any disclaimer, the term of this patent is extended or adjusted under 35 U.S.C. 154(b) by 22 days.

(21) Appl. No.: 14/178,522

(22) Filed: Feb. 12, 2014

(65) Prior Publication Data

US 2015/0230355 A1    Aug. 13, 2015

(51) Int. Cl.
*H02G 15/06* (2006.01)
*H05K 5/02* (2006.01)

(52) U.S. Cl.
CPC ............ *H05K 5/0247* (2013.01); *H05K 5/0221* (2013.01); *H05K 5/0226* (2013.01); *Y10T 29/4984* (2015.01)

(58) Field of Classification Search
CPC .. H05K 5/0247; H05K 5/0221; H05K 5/0226
USPC ............................................... 174/60; 439/49
See application file for complete search history.

(56) References Cited

U.S. PATENT DOCUMENTS 5,575,665 A    11/1996  Shramawick et al.
5,902,961 A *   5/1999  Viklund et al. ............... 174/100
6,884,942 B2 *  4/2005  McGrath et al. ............... 174/68.1
7,097,047 B2    8/2006  Lee et al.
7,510,421 B2    3/2009  Fransen et al.
7,687,716 B2 *  3/2010  Pepe et al. ..................... 174/101

OTHER PUBLICATIONS

Jonathan®, "Pivoting Wire Support", Part No. MCS-2000, Aug. 30, 2012, Copyright © 2012 Jonathan Engineered Solutions. http://www.jonathanengr.com/fixed-cable-support-c-1286.html.
Panduit®, "Pivoting Strain Relief Bar", Panduit Specification Sheet, Oct. 2007, © 2007 PANDUIT Corp. http://www.panduit.com/heiler/SpecificationSheets/ww-ncsp42(pivoting strain relief bar) PDF for web(10-07).pdf.
Panduit™, "Pivoting Strain Relief Bar Customer Drawing", Drawing No. 02589-12, Part No. SRBPBL, May 14, 2007, PANDUIT Corp. http://objects.eanixter.com/PD337089.PDF.

* cited by examiner

*Primary Examiner* — Dhirubhai R Patel
(74) *Attorney, Agent, or Firm* — Zilka-Kotab, PC

(57) ABSTRACT

According to embodiments of the disclosure, assemblies, and methods for cable management are disclosed. The assembly may include a chassis and a cable management apparatus pivotably connected to the chassis. The chassis may have an interior compartment adapted to receive a first and second electronic component. The first electronic component may be adapted to connect to a first cable assembly and the second electronic component may be adapted to connect to a second cable assembly. The cable management apparatus may include a first bracket and second bracket supporting a management arm, the management arm may include two parallel planar bars, the bars fixedly attached together by one or more members perpendicular to the bars. The management arm may be adapted to support at least one of the first and second cable assemblies and may pivot between an operational position and a service position.

20 Claims, 4 Drawing Sheets

PIVOTING CABLE MANAGEMENT ASSEMBLY

BACKGROUND

The present disclosure relates to the field of cable management. Computers may require connections and communication with other devices, power sources, or other locations. Connections and communication may be facilitated by wired connections such as cable assemblies. As computers have increased in complexity, the number of wired connections required has generally increased. Numerous wired connections to a computer may increase the need to effectively manage the physical space taken by those numerous wired connections to and from the computer.

SUMMARY

A cable management assembly may include a chassis having an interior compartment. The chassis may have a first sidewall, a second sidewall, and a bottom sidewall. the first and second sidewalls may oppose one another and the bottom sidewall may be perpendicular to the first and second sidewalls, connected to an edge of the first sidewall and extending to connect to an edge of the second sidewall. The interior compartment may be adapted to receive a first electronic component and a second electronic component. The first electronic component may be adapted to be connected to a first cable assembly and the second electronic component may be adapted to be connected to a second cable assembly.

The first sidewall may have a first pivot point and the second sidewall may have a second pivot point. The first and second pivot points may be positioned so that while the first and second electronic components are positioned in the interior compartment, sandwiching the second electronic component between the first electronic component and the bottom sidewall, the first and second pivot points lie approximately in a first plane which separates the first and second electronic components. The first plane parallel to the bottom sidewall. The cable management assembly may further include a cable management apparatus, external to the chassis. The cable management apparatus may include a first bracket and a second bracket supporting a management arm.

The management arm may include two parallel planar bars, the bars fixedly attached together by one or more members perpendicular to the bars. The management arm may be adapted to support at least one of the first and second cable assemblies. The first bracket may be pivotably connected to the first pivot point and the second bracket may be pivotably connected to the second pivot point. The cable management apparatus may be pivotable on the chassis between an operational position and a service position. The bars may be relatively parallel to the bottom sidewall in the operational position, and the bars may be deflected from the operational position at a specified angle with respect to the bottom sidewall in the service position.

The first and second cable assemblies and the first and second pivot points may be positioned, when within the chassis, at least partially sharing a second plane. The second plane may be perpendicular to the bottom sidewall and to the first and second sidewalls. The first and second bracket may each further include a pivot embossment. Each pivot embossment may pivotably connect to the chassis at the first and second pivot points. The first sidewall may include a first latching point and the second sidewall may include a second latching point.

The cable management apparatus may further include a latch on at least one of the first and second bracket, where the latch may secure to at least one of the first and second latching points when pivoted into the service position. The specified angle with respect to the bottom sidewall may be an angle in a range of ten degrees and eighty degrees. The specified angle with respect to the bottom sidewall may also be forty degrees. At least one of the first and second bracket may include an operational flange. The operational flange may be positioned to support the cable assembly apparatus against the chassis in the operational position. At least one of the first and second bracket may include a stress relief flange. The stress relief flange may be positioned to support the cable assembly apparatus against the chassis in the service position.

The cable management assembly may further include a first electronic component and second electronic component placed within the interior compartment. The first electronic component may be adapted to be connected to a first cable assembly and the second electronic component may be adapted to be connected to a second cable assembly. The first and second electronic components may be placed in the interior compartment, sandwiching the second electronic component between the first electronic component and the bottom sidewall. The first and second electronic components may be separated at a first plane parallel to the supporting sidewall, the first and second pivot points positioned approximately in the first plane.

A method of assembling cable management assembly may include structuring a chassis having an interior compartment. The chassis may have a first sidewall, a second sidewall, and a bottom sidewall. the first and second sidewalls may oppose one another and the bottom sidewall may be perpendicular to the first and second sidewalls, connected to an edge of the first sidewall and extending to connect to an edge of the second sidewall. The interior compartment may be adapted to receive a first electronic component and a second electronic component. The first electronic component may be adapted to be connected to a first cable assembly and the second electronic component may be adapted to be connected to a second cable assembly.

The first sidewall may have a first pivot point and the second sidewall may have a second pivot point. The first and second pivot points may be positioned so that while the first and second electronic components are positioned in the interior compartment, sandwiching the second electronic component between the first electronic component and the bottom sidewall, the first and second pivot points lie approximately in a first plane which separates the first and second electronic components. The first plane may be parallel to the bottom sidewall. The method of assembling the cable management assembly may further include structuring a cable management apparatus, external to the chassis. The cable management apparatus may include a first bracket and a second bracket supporting a management arm.

The management arm may include two parallel planar bars, the bars fixedly attached together by one or more members perpendicular to the bars. The management arm may be adapted to support at least one of the first and second cable assemblies. The first bracket may be pivotably connected to the first pivot point and the second bracket may be pivotably connected to the second pivot point. The cable management apparatus may be pivotable on the chassis between an operational position and a service position. The bars may be relatively parallel to the bottom sidewall in the operational position, and the bars may be deflected from the operational position at a specified angle with respect to the bottom sidewall in the service position.

DETAILED DESCRIPTION

In the following description, reference is made to the accompanying drawings which, by way of illustration, include various examples by which the disclosure may be used. Other examples of the disclosure may be used, as structural and operational changes may be made without departing from the scope of the present disclosure.

While the same nomenclature and same numbers may be used to identify elements throughout the disclosure, this practice is not intended to limit the scope of the disclosure. Identified elements in one figure may not be identical to other same named or identified elements in other figures.

The present disclosure relates to a cable management assembly. Computers, including servers or other types of computers, may communicate with the outside world. This communication may be facilitated by wired connections which may typically connect electronic components of the computer to power sources, to other components, to other computers, or to other various locations. This connection may be performed through wired connections which may include one or more cable assemblies. As a computer utilizes numerous electronic components, a large number of wired connections may be required. As the number of required wired connections increases the number of cable assemblies connecting to and from the computer may increase.

Electronic components, such as a server, computer, or other electronic components, may typically be installed in chassis. The chassis, may be installed into a rack. When installed in a chassis, large quantities of cable assemblies connecting to the electronic components may be difficult to manage, as the chassis may limit physical access to the electronic components. Furthermore, the physical access allowed by the chassis to the electronic components may be occupied by the cable assemblies connecting to the components. Limited access to the electronic components may increase difficulty of performing maintenance, installing new components, removing components, cleaning components, or performing other tasks which require physical access to electronic components. Thus, a cable management assembly may be utilized to organize cable assemblies and to increase access to electronic components.

A cable management assembly may include a chassis and a cable management apparatus pivotably connected to the chassis. The chassis may have an interior compartment adapted to receive a first and second electronic component. The first electronic component may be adapted to connect to a first cable assembly and the second electronic component may be adapted to connect to a second cable assembly. The cable management apparatus may include a first bracket and second bracket supporting a management arm, the management arm may include two parallel planar bars, the bars fixedly attached together by one or more members perpendicular to the bars. The management arm may be adapted to support at least one of the first and second cable assemblies.

Figure 1:
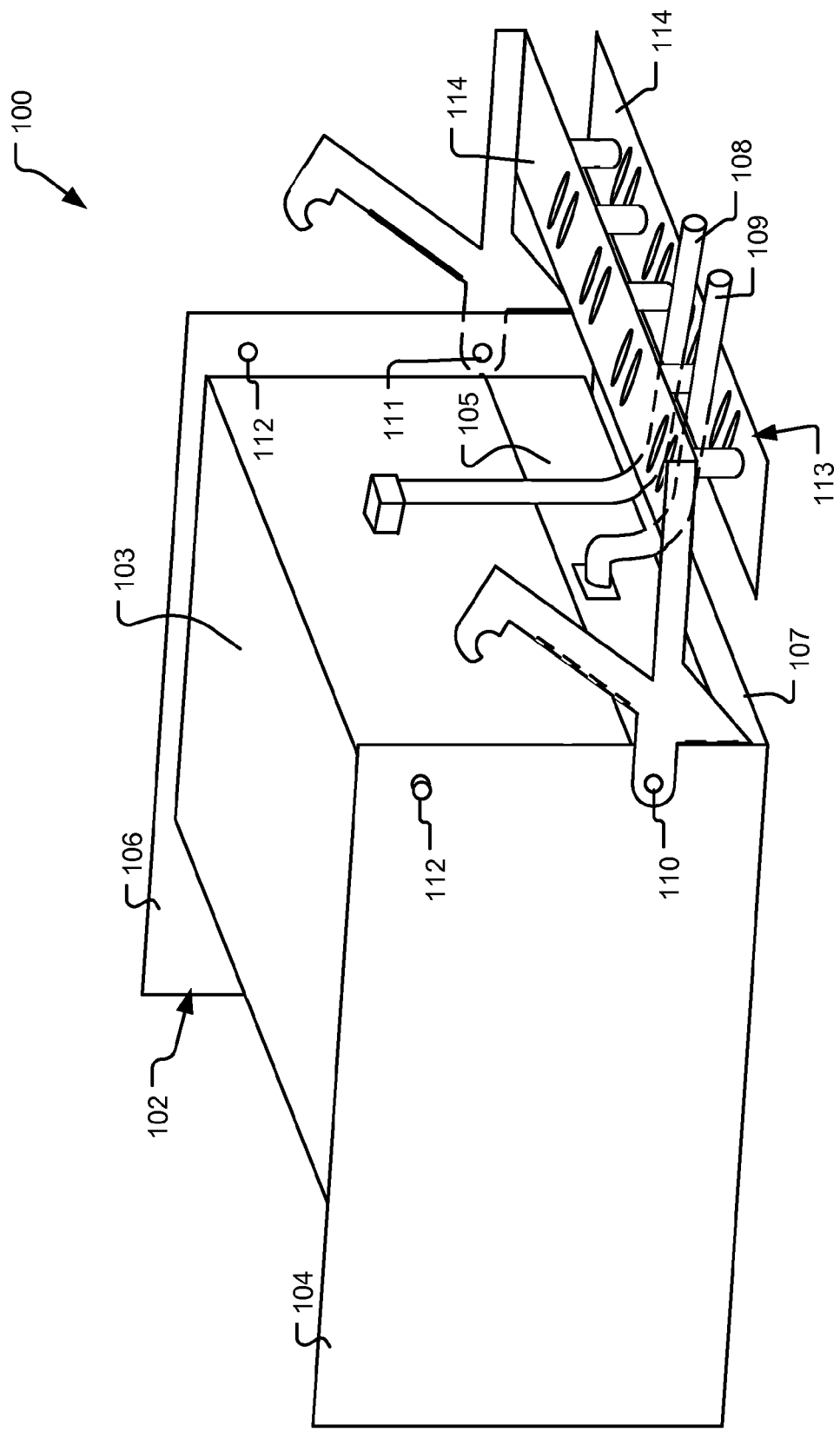
FIG. 1 is a perspective view, according to an embodiment, of a cable management assembly including a chassis and a cable management apparatus in an operational position.
Figure 2:
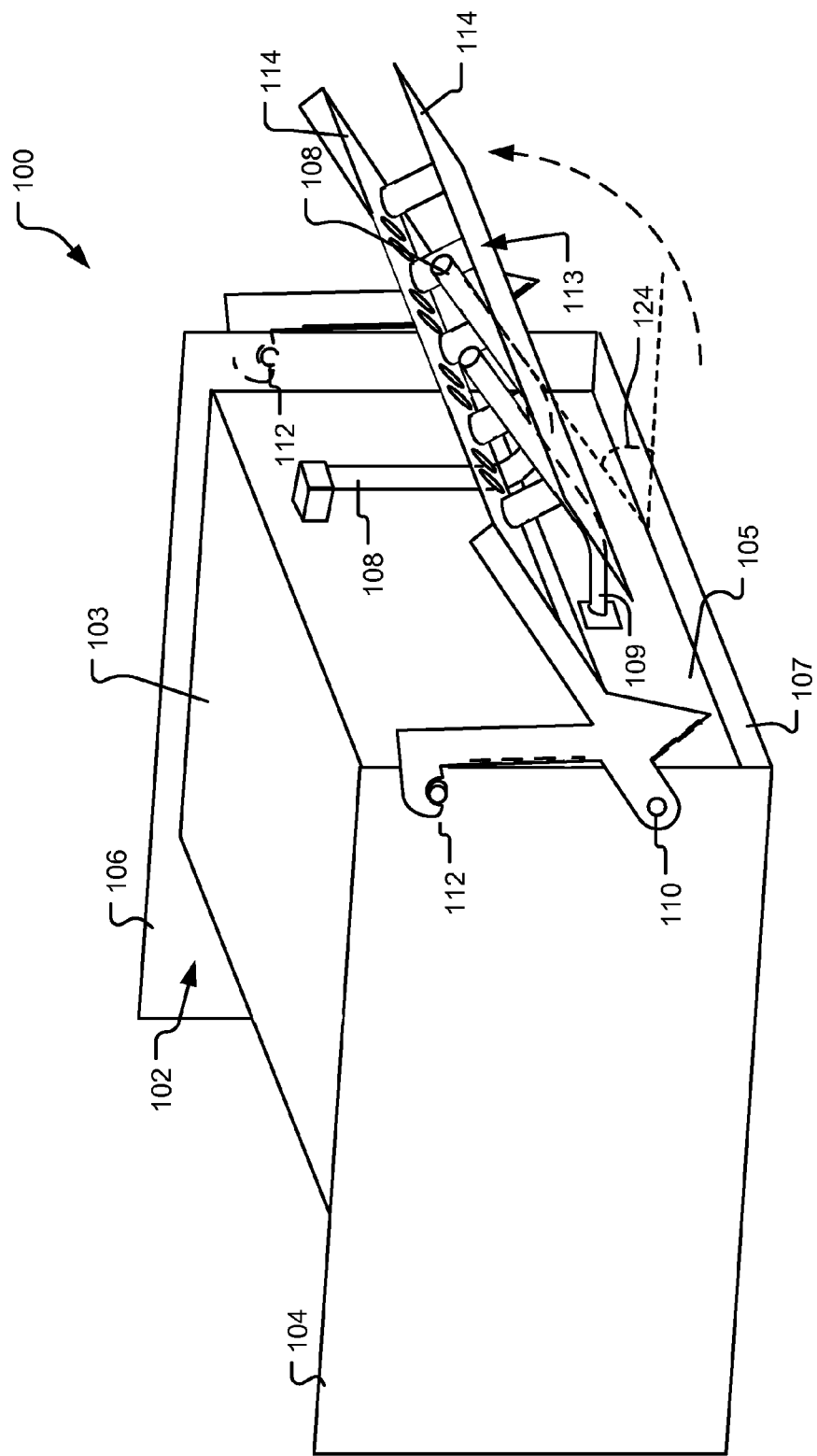
FIG. 2 is a perspective view, according to an embodiment, of a cable management assembly including a chassis and a cable management apparatus in a service position.

Referring now to FIGS. 1 and 2, a cable management assembly 100 may include a chassis 102 having a first sidewall 104 a second sidewall 106, and a bottom sidewall 107. The chassis may have an interior compartment adapted to receive a first electronic component 103 and a second electronic component 105. The first electronic component may be adapted to connect to a first cable assembly 108. The second electronic component may be adapted to connect a second cable assembly 109. The cable management assembly 100 may further include a cable management apparatus 113. The cable management apparatus 113 may be external to the chassis 102 and connect to the chassis 102 at first and second pivot points 110, 111. The cable management apparatus 113 may pivot on the chassis 102 between an operational position, as seen in FIG. 1, and a service position, as seen in FIG. 2. The cable management apparatus 113 may lock in the service position by latching to the chassis at one or more of the latching points 112.

The chassis 102 may provide a body on which a cable management apparatus 113 may be pivotably mounted and may provide an interior compartment in which electronic components 103, 105 may be placed. The chassis 102 may have a framework including a first sidewall 104, a second sidewall 106, and a bottom sidewall 107. The first and second sidewalls 104, 106, may be positioned opposing one another. The bottom sidewall 107 may be perpendicular to the first and second sidewalls 104, 106 and connected to an edge of the first sidewall and extending to connect to an edge of the second sidewall. The chassis 102 may have an interior compartment formed by the framework of the first and second sidewalls 104, 106 and the bottom sidewall 107.

The internal compartment may be adapted for receiving one or more electronic components 103, 105. The electronic components 103, 105, may include various computers, servers, or other devices which may be placed within the chassis 102. The electronic components 103, 105 may be adapted to connect to one or more cable assemblies 108, 109, which may provide paths for communication, for power supply, or supply other requirements of the electronic component 103. In an embodiment, a first electronic component 103 and a second electronic component 105 may be placed within the chassis 102. The first electronic component 103 may be adapted to connect to a first cable assembly 108. The second electronic component 105 may be adapted to connect to a second cable assembly 109. The first and second electronic components 103, 105 may be positioned in the interior compartment, sandwiching the second electronic component 105 between the first electronic component 103 and the bottom sidewall 107.

The electronic components 103, 105, may require maintenance, such as cleaning, repair, or other tasks, which may require a user to have physical access to the electronic component 103. The first and second cable assemblies 108, 109 when within the chassis 102, may be positioned at least partially parallel to the first and second sidewalls 104, 106. The cable assembly 108 may include multiple cables, however, in FIGS. 1 and 2 only a single cable is shown. The other cables are omitted to clearly show elements of the cable management assembly 100 that these cables would otherwise obscure. The first and second sidewalls 104, 106 each may have a first pivot point 110, and a second pivot point 111, respectively.

The first and second sidewalls 104, 106 may also have one or more latching points 112. The first and second pivot points may be positioned to lie approximately in a first plane which separates the first and second electronic components 103, 105, the first plane parallel to the bottom sidewall. The first and second pivot points 110, 111 may also be positioned such that, while the electronic components 103, 105 are in place, the first and second pivot points 110, 111 at least partially share a second plane of at least one of the first and second cable assemblies 108, 109. The placement of the pivot points 110 at least partially aligned with the plane of the cable assembly may increase the lifespan of the cable assembly 108, as the stress of bending the cable assembly 108 may required to access system components may be decreased.

The first and second pivot points 110, 111 may be an opening in which the cable management apparatus 113 may be mounted. In an embodiment, the first and second pivot points 110, 111 are holes in which embossments on the cable management apparatus 113 may be flexibly snapped into place. In other embodiments however, the cable management apparatus 113 may be riveted or secured in other manner which allows for pivoting movement on the chassis 102. The latching points 112 may be a point at which the cable management apparatus 113 may secure to the chassis 102 in the service position.

The latching points 112 may be a pawl pin extending outward perpendicularly from the first and second sidewalls 104, 106. The cable management apparatus 113 may latch to the pawl pin when the cable management apparatus 113 is rotated into the service position. In another embodiment, the latching points 112 may be holes in which embossments on the cable management apparatus 113 are snapped into place when the cable management apparatus 113 is rotated into the service position. In another embodiment, the latching points 112 may be holes in which holes on the cable management apparatus 113 are pinned into place when the apparatus 113 is rotated into the service position. The chassis 102 may be constructed from various materials, including metal, plastic, or other type of material, which may allow the cable management apparatus 113, to be pivotably mounted to the chassis 102.

The cable management apparatus 113 may be pivotably connected to the chassis 102 and may be pivotable between an operational position as seen in FIG. 1, and a service position, as seen in FIG. 2. The cable management apparatus 113 may be external to the chassis and connect to the exterior of the first and second sidewalls 104, 106 at the first and second pivot points, 110, 111. Described further below, the cable management apparatus 113 may include two parallel planar bars 114. The bars may be being relatively parallel to the bottom sidewall 107 in the operational position. When the electronic components 103, 105 having at least one of the first and second cable assemblies 108, 109 are inserted within the chassis 102 the cable management apparatus 113 may support the cable assembly 108 in the operational position as the cable assembly 108 exits the chassis 102.

The service position may deflect the bars 114 from the operational position at a specified angle 124 with respect to the bottom sidewall 107. Pivoting the cable management apparatus 113 into the service position may allow for increased access to electronic components 103, 105 inserted in the chassis 102. Specifically, the service position may allow for greater access to the second electronic component 105. Increasing access to the first and second electronic components 103, 105 may allow for easier maintenance, cleaning, repairing, or other actions. For example, where the first electronic component 103, 105 are peripheral component interconnect devices inserted within the chassis 102, pivoting the cable management apparatus 113 into the service position may increase access to second electronic component 105 which may be power supplies for the first electronic component.

The specified angle 124 may be selected as an angle which may result in structurally acceptable bend in the first and second cable assembly 108, 109 while providing sufficient space to access components in the chassis 102. In an embodiment, the specified angle with respect to the bottom sidewall is selected to be forty (40) degrees. In another embodiment the specified angle may be selected as an angle within the range of ten (10) to eighty (80) degrees. However, in other embodiments the specified angle may be selected as any angle. The specified angle may be a fixed angle so that when the cable management apparatus 113 is pivoted into the service position the cable assembly 108 may be only deflected at the specified angle 124.

Degradation of the cable assembly 108 may result in electronic component 103 failure, loss of power, or other problems. A fixed specified angle 124 which the cable management apparatus 113 pivots may make the deflection or bend in the cable assembly known and predictable. A predictable bend in the cable assemblies 108, 109 may reduce the stress on the cable assemblies 108, 109 and may result in increased lifespan of the cable assemblies 108, 109, as the cable assemblies 108, 109 may be selected which are designed to bend at the specified angle. Thus, the service position may also be referred to as a stress relief position. Furthermore, the time until failure of the cable assemblies 108, 109 may be more easily predicted. Described further below, the specified angle 124 may depend on the design of the cable management apparatus 113, particularly the placement of a pivot point and a latch on the cable management apparatus 113.

Figure 3A:
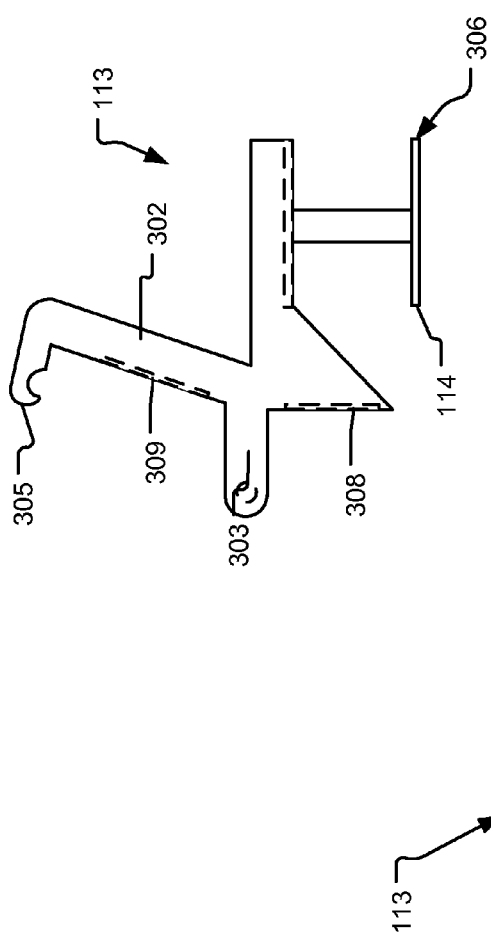
FIG. 3A is a side view, according to an embodiment, of a cable management apparatus.
Figure 3B:
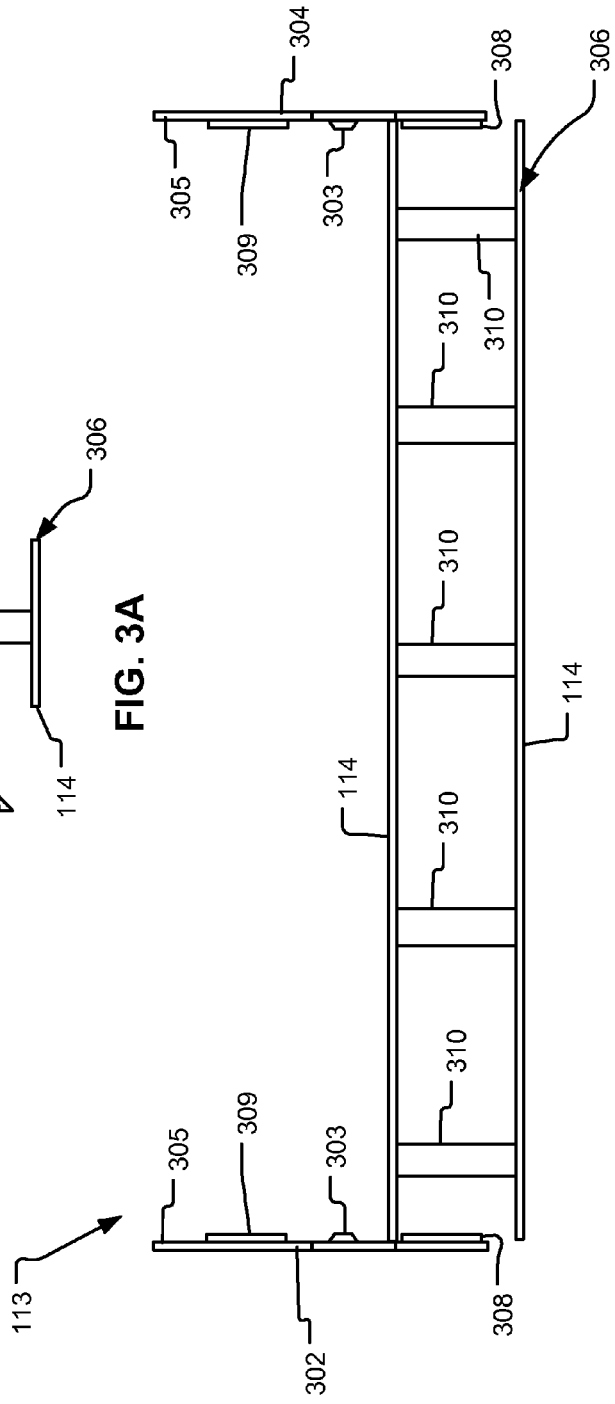
FIG. 3B is a front view, according to an embodiment, of a cable management apparatus.
Figure 3C:
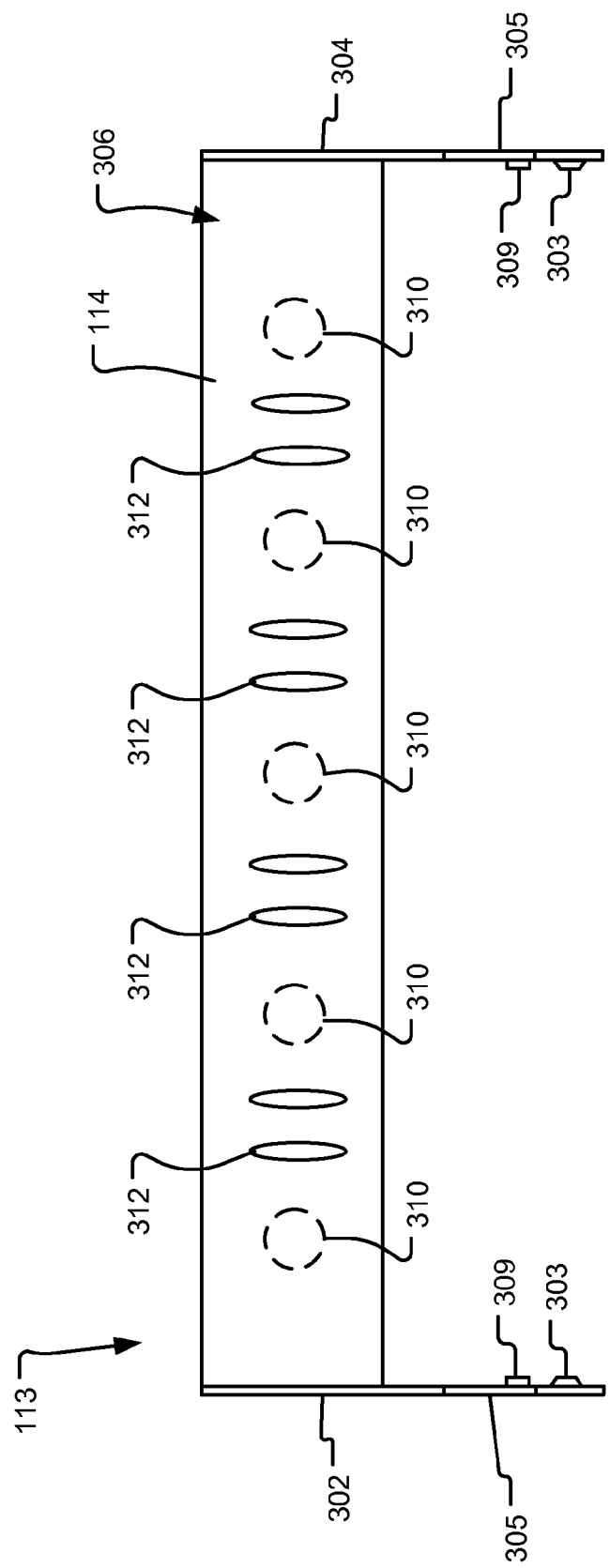
FIG. 3C is a top view, according to an embodiment, of a cable management apparatus.

Referring now to FIGS. 3A, 3B, and 3C, a side view, front view, and top view of the cable management apparatus may be seen according to an embodiment. The cable management apparatus 113 may include a first bracket 302 and second bracket 304. The first and second brackets may support a management arm 306 which connects the first bracket 302 and the second bracket 304. The management arm 306 may include two parallel, planar bars 114 fixedly attached by one or more members 310. The one or more members 310 may be at a right angle to the bars 114. The planar bars 114 may have one or more pairs of slots 312 positioned on the one or more members 310. However, in other embodiments, the management arm 306 may be constructed as a single planar bar fixedly attached to the first and second brackets 302, 304. The management arm 306 and the slots 312 may be used to manage cable assemblies. In an embodiment, cable assemblies may be secured to the management arm 306 by straps run through the slots 312. The cable management apparatus 113 may be made of various materials including metal, plastic, or other materials which allow the cable management apparatus 113 to be pivotably mounted on a chassis. The cable management apparatus 113 may be constructed as a single piece of material, or may be fastened together from multiple pieces of material. The elements of the cable management apparatus 113 may be glued together, welded, or fastened together using other methods. The first and second brackets 302, 304 may allow the cable management apparatus 113 to pivotably connect to the chassis.

The first and second brackets 302, 304 may have a pivot embossment 303, latch 305, operational flanges 308 and stress relief flanges 309. The pivot embossment 303 may be a raised surface from the first and second bracket 302, 304 that pivotably connects the first and second brackets 302, 304 to the chassis at the first and second pivot points 110, 111 shown in FIG. 1. Referring again to FIGS. 3A-3C, in an embodiment, the pivot embossment 303 may be flexibly snapped into the chassis. However it is contemplated that the first and second brackets 302, 304 may be pivotably attached to the chassis at the first and second pivot points 110, 111 using various methods including riveting, screws, or other fasteners. The latch 305 may attach to the chassis and secure the cable management apparatus 113 in a service position, as described above with reference to the previous figures. In an embodiment, the latch 305 may instead be a latch embossment. The latch embossment may be a raised surface from the first and second bracket 302, 304, which may flexibly be snapped into the chassis. In another embossment, the latch 305 may be toothed to allow the cable management apparatus 113 to secure in the service position having various specified angles with respect to a bottom sidewall of the chassis.

The operational flange 308 and the stress relief flange 309 may lie flat on the chassis and may allow greater stability in both the operational position and the service position by supporting the cable management apparatus 113 against the chassis. The operational flange 308 may be positioned to support the cable assembly apparatus against the chassis in the operational position, and the stress relief flange 309 may be positioned to support the cable assembly apparatus against the chassis in the service position.

The foregoing description of exemplary embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather determined in view of what would be apparent to those skilled in the art from the description provided herein and the claims appended hereto.

We claim:

1. A cable management assembly comprising:
a chassis having an interior compartment, the chassis having a first sidewall, a second sidewall, and a bottom sidewall, the first and second sidewalls opposing one another, the bottom sidewall perpendicular to the first and second sidewalls and connected to an edge of the first sidewall and extending to connect to an edge of the second sidewall, the interior compartment configured to receive a first electronic component and a second electronic component, the first electronic component configured to be connected to a first cable assembly and the second electronic component configured to be connected to a second cable assembly, the first sidewall having a first pivot point and the second sidewall having a second pivot point, the first and second pivot points positioned so that while the first and second electronic components are positioned in the interior compartment, sandwiching the second electronic component between the first electronic component and the bottom sidewall, the first and second pivot points lie approximately in a first plane which separates the first and second electronic components, the first plane parallel to the bottom sidewall;
a cable management apparatus, external to the chassis, including:
a first bracket and a second bracket supporting a management arm, the management arm including two parallel planar bars, the bars fixedly attached together by one or more members perpendicular to the bars, the management arm configured to support at least one of the first and second cable assemblies;
the first bracket pivotably connected to the first pivot point and the second bracket pivotably connected to the second pivot point;
wherein the cable management apparatus is pivotable on the chassis between an operational position and a service position, the bars being relatively parallel to the bottom sidewall in the operational position, and the bars deflected from the operational position at an angle with respect to the bottom sidewall in the service position.

2. The assembly of claim 1, wherein at least one of the first and second cable assemblies and the first and second pivot points are positioned, when within the chassis, at least partially sharing a second plane, the second plane perpendicular to the bottom sidewall and to the first and second sidewalls.

3. The assembly of claim 1, wherein the first and second bracket each further include: a pivot embossment; wherein each pivot embossment pivotably connects to the chassis at the first and second pivot points.

4. The assembly of claim 1, wherein the first sidewall includes a first latching point and the second sidewall includes a second latching point.

5. The assembly of claim 4, wherein the cable management apparatus further includes a latch on at least one of the first and second bracket, wherein the latch secures to at least one of the first and second latching points when pivoted into the service position.

6. The assembly of claim 1, wherein the bars are deflected from the operational position by an angle in a range of ten degrees and eighty degrees with respect to the bottom sidewall when in the service position.

7. The assembly of claim 6, wherein the angle with respect to the bottom sidewall is forty degrees.

8. The assembly of claim 1, wherein at least one of the first and second bracket include an operational flange, wherein the operational flange is positioned to support the cable management apparatus against the chassis in the operational position.

9. The assembly of claim 1, wherein at least one of the first and second bracket include a stress relief flange, wherein the stress relief flange is positioned to support the cable management apparatus against the chassis in the service position.

10. The assembly of claim 1, comprising:
the first electronic component and the second electronic component positioned in the interior compartment.

11. The assembly of claim 10, wherein the at least one of the first and second cable assemblies and the first and second pivot points are positioned within the chassis, and at least partially share a second plane, the second plane perpendicular to the bottom sidewall and to the first and second sidewalls.

12. The assembly of claim 10, wherein the first and second bracket each further include: a pivot embossment; wherein each pivot embossments pivotably connect to the chassis at the first and second pivot points.

13. The assembly of claim 10, wherein the first sidewall includes a first latching point and the second sidewall includes a second latching point.

14. The assembly of claim 13, wherein the cable management apparatus further includes a latch on at least one of the first and second bracket, wherein the latch secures to at least one of the first and second latching points when pivoted into the service position.

15. A method of assembling a cable management assembly comprising:
structuring a chassis having an interior compartment, the chassis having a first sidewall, a second sidewall, and a bottom sidewall, the first and second sidewalls opposing one another, the bottom sidewall perpendicular to the first and second sidewalls and connected to an edge of the first sidewall and extending to connect to an edge of the second sidewall, the interior compartment configured to receive a first electronic component and a second electronic component, the first electronic component configured to be connected to a first cable assembly and the second electronic component configured to be connected to a second cable assembly, the first sidewall having a first pivot point and the second sidewall having a second pivot point, the first and second pivot points positioned so that while the first and second electronic components are positioned in the interior compartment, sandwiching the second electronic component between the first electronic component and the bottom sidewall, the first and second pivot points lie approximately in a first plane which separates the first and second electronic components, the first plane parallel to the bottom sidewall;

structuring a cable management apparatus, external to the chassis, including: a first bracket and a second bracket supporting a management arm, the management arm including two parallel planar bars, the bars fixedly attached together by one or more members perpendicular to the bars, the management arm configured to support at least one of the first and second cable assemblies;

the first bracket pivotably connected to the first pivot point and the second bracket pivotably connected to the second pivot point;

wherein the cable management apparatus is pivotable on the chassis between an operational position and a service position, the bars being relatively parallel to the bottom sidewall in the operational position, and the bars deflected from the operational position at an angle with respect to the bottom sidewall in the service position.

16. The method of claim 15, wherein at least one of the first and second cable assemblies and the first and second pivot points are positioned, when within the chassis, at least partially sharing a second plane, the second plane perpendicular to the bottom sidewall and to the first and second sidewalls.

17. The method of claim 15, wherein the first and second bracket each further include: a pivot embossment; wherein each pivot embossment pivotably connects to the chassis at the first and second pivot points.

18. The method of claim 15, wherein the first sidewall includes a first latching point and the second sidewall includes a second latching point.

19. The method of claim 18, wherein structuring the cable management apparatus further includes a latch on at least one of the first and second bracket, wherein the latch secures to at least one of the first and second latching points when pivoted into the service position.

20. The method of claim 19, wherein at least one of the first and second bracket includes an operational flange, wherein the operational flange is positioned to support the cable management apparatus against the chassis in the operational position, and wherein at least one of the first and second bracket each further includes a stress relief flange, wherein the stress relief flange is positioned to support the cable management apparatus against the chassis in the service position.

* * * * *